United States Patent
Willer

(10) Patent No.: US 7,341,904 B2
(45) Date of Patent: Mar. 11, 2008

(54) CAPACITORLESS 1-TRANSISTOR DRAM CELL AND FABRICATION METHOD

(75) Inventor: Josef Willer, Riemerling (DE)

(73) Assignees: Infineon Technologies AG, Munich (DE); Infineon Technologies Flash GmbH & Co. KG, Dresden (DE)

( * ) Notice: Subject to any disclaimer, the term of this patent is extended or adjusted under 35 U.S.C. 154(b) by 128 days.

(21) Appl. No.: 11/367,731

(22) Filed: Mar. 3, 2006

(65) Prior Publication Data

US 2006/0177980 A1  Aug. 10, 2006

Related U.S. Application Data

(60) Division of application No. 10/911,994, filed on Aug. 5, 2004, now Pat. No. 7,034,336, which is a continuation of application No. PCT/DE03/00181, filed on Jan. 23, 2003.

(30) Foreign Application Priority Data

Feb. 6, 2002  (DE) ................. 102 04 871

(51) Int. Cl.
  *H01L 21/8239* (2006.01)
(52) U.S. Cl. ............ 438/199; 438/218; 438/FOR. 216; 257/E21.632; 257/E21.646
(58) Field of Classification Search ........... 438/199, 438/218, FOR. 216; 257/E21.632, E21.646
  See application file for complete search history.

(56) References Cited

U.S. PATENT DOCUMENTS

| | | | |
|---|---|---|---|
| 4,786,953 A * | 11/1988 | Morie et al. ............. 257/331 |
| 5,497,017 A | 3/1996 | Gonzales | |
| 5,744,386 A | 4/1998 | Kenney | |
| 5,744,847 A * | 4/1998 | Wen ........................ 257/397 |
| 5,763,310 A * | 6/1998 | Gardner ................... 438/270 |
| 5,940,707 A * | 8/1999 | Gardner et al. ........... 438/270 |
| 6,111,778 A | 8/2000 | MacDonald et al. | |
| 6,521,935 B2 | 2/2003 | Krautschneider et al. | |
| 6,750,095 B1 | 6/2004 | Bertagnoll et al. | |

FOREIGN PATENT DOCUMENTS

| | | |
|---|---|---|
| DE | 199 29 211 A1 | 1/2001 |
| JP | 63-142850 | 6/1988 |
| JP | 02-226762 | 9/1990 |
| WO | WO 00/19529 A1 | 4/2000 |

OTHER PUBLICATIONS

Wann, H., et al., "A Capacitorless DRAM Cell on SOI Substrate," IEDM, 1993, pp. 635-638.
Okhonin, S., et al., "A SOI Capacitor-less 1T-DRAM Concept," 2001 IEEE International SOI Conference, Oct. 2001, pp. 153-154.

* cited by examiner

*Primary Examiner*—Thanh Van Pham
(74) *Attorney, Agent, or Firm*—Slater & Matsil, L.L.P.

(57) ABSTRACT

A semiconductor device is fabricated by forming a trench in a semiconductor body. A region of dielectric material is formed within at least a lower portion of the trench. An upper portion of the semiconductor body is doped. A cutout is formed in the semiconductor material such that a vertical strip of semiconductor material remains along a sidewall of the dielectric material. A lower portion of the semiconductor body adjacent the sidewall of the dielectric material is doped. A gate dielectric layer is formed over the vertical strip of semiconductor material and a gate electrode is arranged in the cutout.

19 Claims, 5 Drawing Sheets

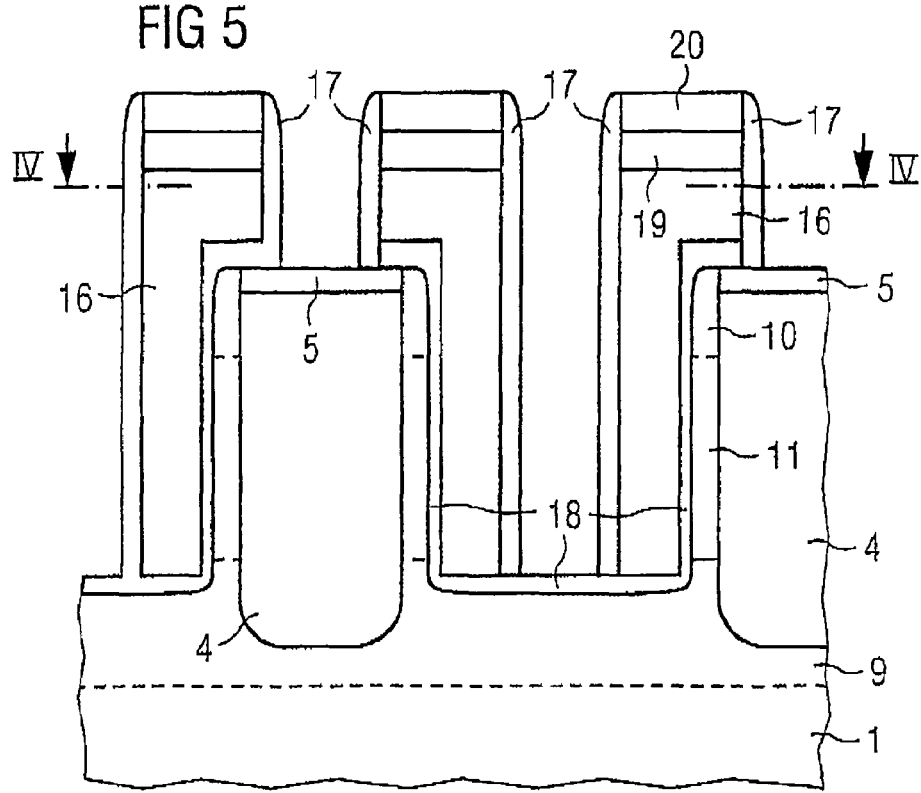
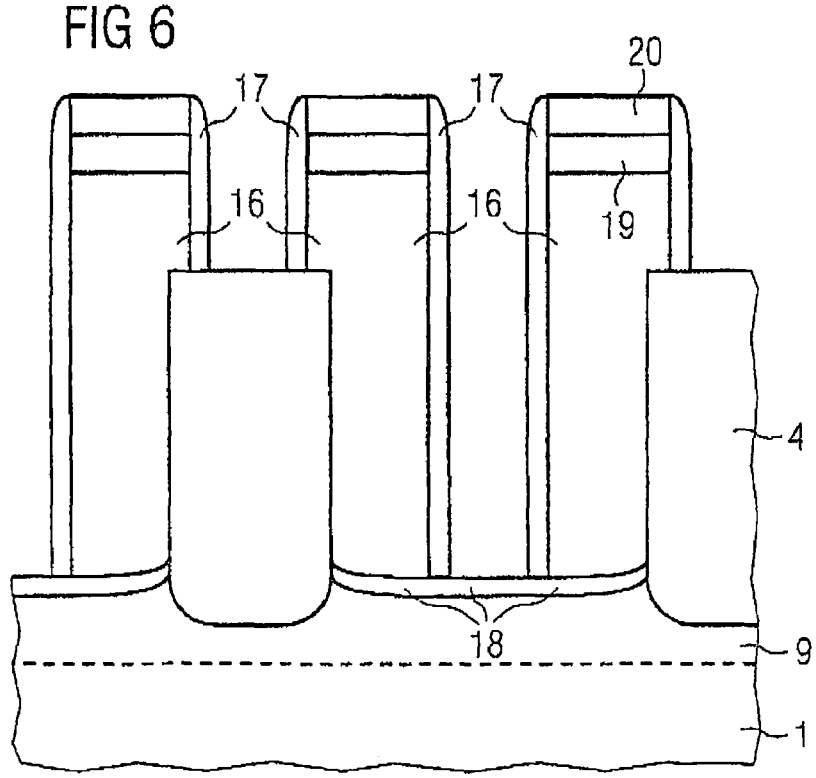

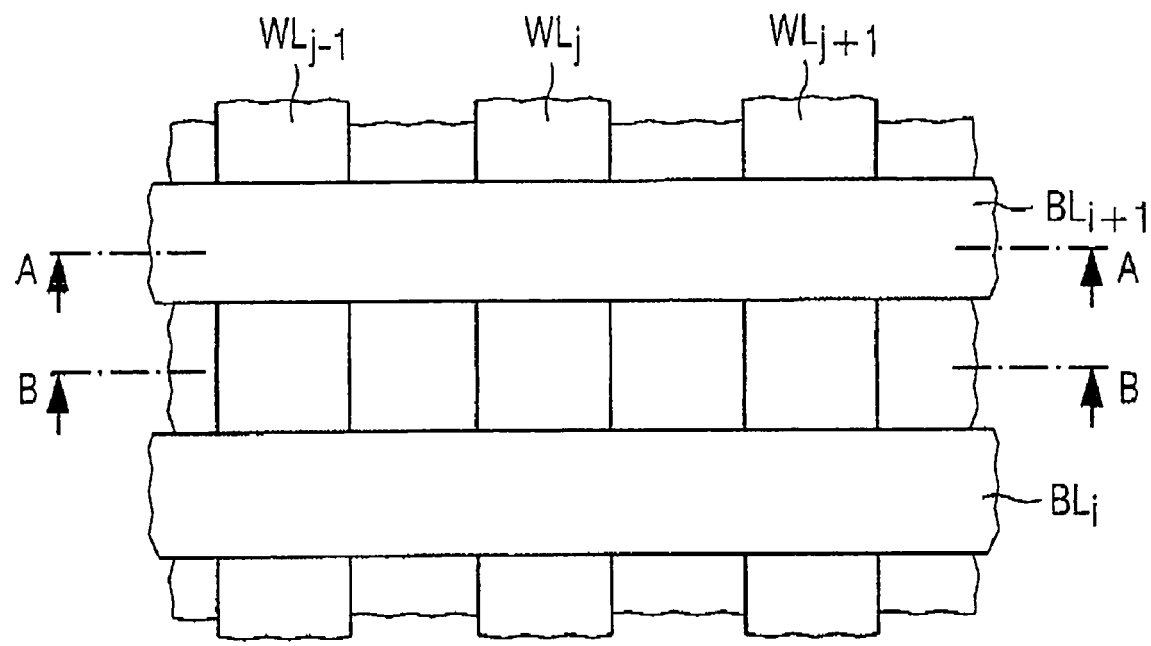

CAPACITORLESS 1-TRANSISTOR DRAM CELL AND FABRICATION METHOD

This application is a divisional of U.S. patent application Ser. No. 10/911,994, filed on Aug. 5, 2004 now U.S. Pat. No. 7,034,336, which is a continuation of PCT application PCT/DE03/00181, filed on Jan. 23, 2003 and published in German on Aug. 14, 2003, which application claims priority to German patent application 102 04 871.1, filed Feb. 6, 2002. All of these applications are incorporated herein by reference.

TECHNICAL FIELD

The present invention relates to a capacitorless 1-transistor DRAM cell, simply referred to as 1-transistor DRAM cell hereinafter, and an associated fabrication method.

BACKGROUND

S. Okhonin, M. Nagoga, J. M. Sallese and P. Fazan from the Ecole Polytechnique Federale de Lausanne (Preprint and Presentation at the IEEE SOI Conference, ISS/EPFL 2001) have proposed an embodiment of DRAM cells in the sub-100 nm range in which the memory cell is arranged as transistor structure in the body silicon layer of an SOI substrate. This concept dispenses with a formation of a capacitor that is specially provided for each cell. The semiconductor material which comprises the source region, the channel region and the drain region is in this case enclosed on all sides by $SiO_2$ as electrically insulating material. A channel region that is not connected to a defined potential is thus present, which channel region, during operation of the cell, forms a zone that is fully or at least partially depleted of charge carriers (partially to fully depleted floating body). A gate electrode isolated from the channel region by a gate dielectric is situated on the top side.

The MOS transistor structure formed in this way is suitable for storing the charge which represents one bit. Disadvantages of this embodiment are the use of a comparatively expensive SOI substrate and the necessary compromise between a small space requirement sought for the cell and the gate length that can be realized.

SUMMARY OF THE INVENTION

In one aspect, the present invention specifies a space-saving 1-transistor DRAM cell that can be fabricated in a cost-effective manner and can be used to fabricate a memory cell array.

In the case of the (capacitorless) 1-transistor DRAM cell, the channel region and the source-drain regions are arranged vertically at a sidewall of a dielectric trench filling. On the side opposite to the trench filling, the semiconductor material is bounded by the gate dielectric and the gate electrode arranged above the latter. The gate electrode is arranged in a cutout of the semiconductor material.

A memory cell array comprising 1-transistor DRAM cells of this type comprises, in a semiconductor chip, a multiplicity of vertically oriented strip-type semiconductor regions in which source-drain regions are in each case implanted in an upper and lower portion and a channel region that is not connected to a defined potential is present in the central region in between, which channel region is embedded in insulating material on all sides in a sectional plane that is co-planar with respect to the plane of the top side of the semiconductor chip. In this case, the plane of the top side of the semiconductor chip is to be understood as a plane which is co-planar with respect to a top side of a wafer used during the fabrication, which top side is provided with the cells and is at least originally planar, or with respect to the planes of a grown layer structure or applied passivation.

BRIEF DESCRIPTION OF THE DRAWINGS

Examples of the 1-transistor DRAM cell and preferred fabrication methods are described in more detail below with reference to FIGS. 1 to 9.

FIGS. 1, 2, 5, 6 and 7 show cross-sections through intermediate products of a fabrication method;

FIG. 9 shows an arrangement of the word lines and bit lines of a memory cell array in plan view.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The orientation of the word lines $WL_{j-1}$, $WL_j$, $WL_{j+1}$, and of the bit lines $BL_i$, $BL_{i+1}$, which are routed such that they run transversely above the word lines, is illustrated in a diagrammatic plan view of a memory cell array in FIG. 9. Broken lines additionally depict the positions of two cross-sections A and B; these positions correspond to the positions of the cross-sections of FIGS. 5 and 6, which will be explained below. A crosspoint DRAM architecture in accordance with the illustration of FIG. 9 manages with an area requirement of $4F^2$ per cell.

Figure 1:
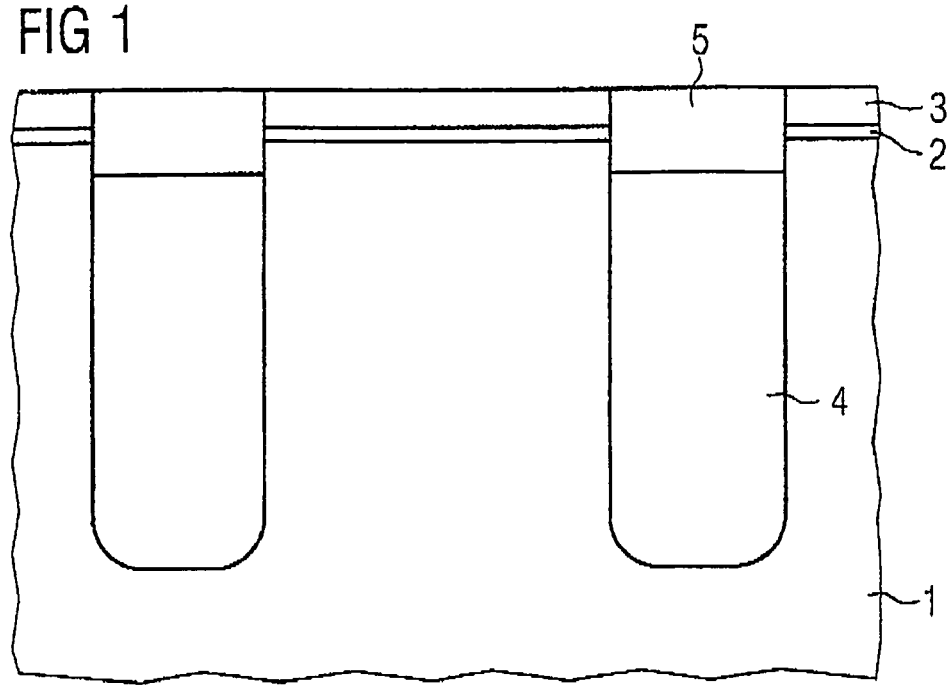

The structure of the cells is explained below with reference to preferred fabrication methods. The fabrication process preferably begins with method steps, which are known per se from semiconductor technology. In accordance with the cross-section illustrated in FIG. 1, firstly a layer as pad oxide 2 and a layer as pad nitride 3 are applied in the customary manner on a semiconductor body 1 or a substrate. Trenches oriented parallel to one another are then fabricated in the manner of an STI (shallow trench isolation) by means of a suitable photomask technique. To that end, the semiconductor material is etched out in the region of the mask openings.

The trenches are filled with an oxide or another dielectric material 4. If appropriate, there follow suitable measures for planarization, such as e.g., CMP (chemical mechanical polishing). The p-type wells and n-type wells for CMOS components of the driving periphery are preferably also fabricated. That can be done in the customary manner by means of boron and phosphorus implantation, respectively, and annealing of the implants.

The dielectric material 4 in the trenches is removed in the upper region of the trenches, so that an electrically conductive layer 5 can in each case be introduced there up to the upper edge of the trenches. These electrically conductive layers 5, which in each case run in strip form in the trenches, are in contact laterally with the semiconductor material of the semiconductor body 1 or substrate. It is expedient for the subsequent method steps if polysilicon is used for the electrically conductive layers 5 and this polysilicon is oxidized somewhat at the top side of the layers, the volume of the relevant layer portion 6 increasing. An oxide mask is formed in this way. The nitride of the pad nitride layer 3 is then removed. The etching attack can be protected in part by means of a photomask technique, which is beneficial particularly in the region of the driving periphery.

Spacer elements (spacers) of a mask for a self-aligned patterning of the active trenches that are subsequently to be fabricated are fabricated preferably by means of a renewed deposition of nitride or TEOS. The active trenches are provided on the one hand for delimiting the semiconductor material at the sidewalls of the trench fillings made of dielectric material 4 and on the other hand for accommodating the gate electrodes used for the driving of the channel regions.

For the upper source-drain regions with regard to the semiconductor body or substrate, firstly an n$^+$-type implantation is introduced (e.g., by means of arsenic). If appropriate, an LDD (lightly doped drain) may additionally be fabricated by an implantation of phosphorus.

Figure 2:
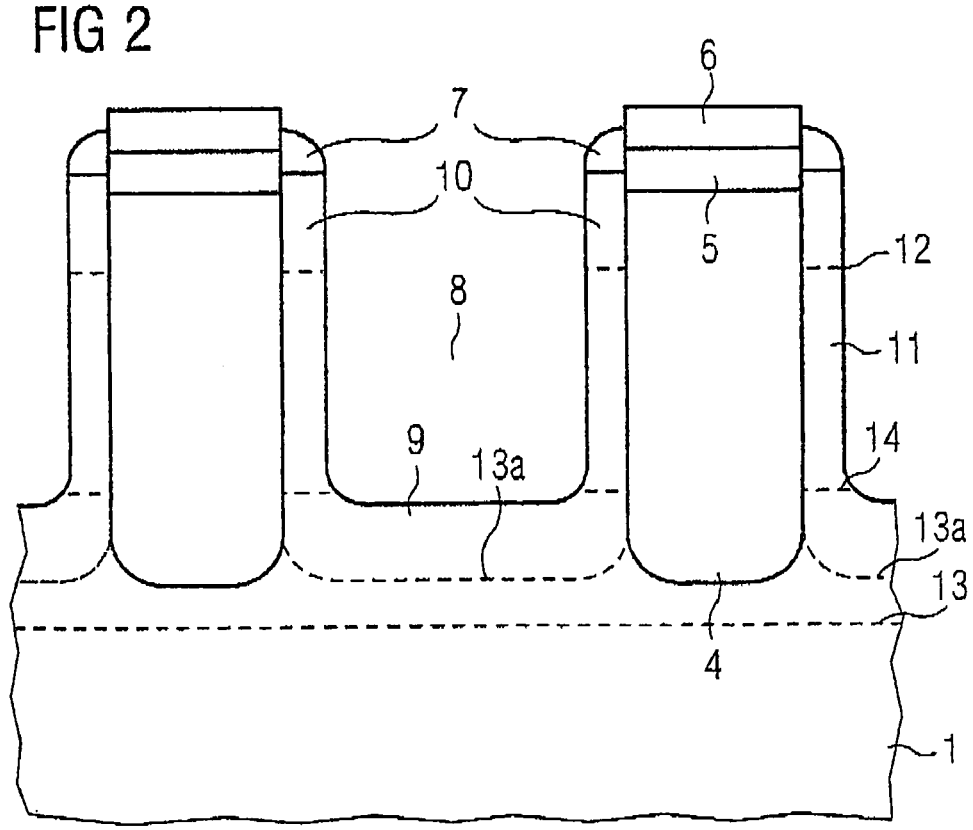

The structure is thus produced in accordance with the illustration in FIG. 2, in the case of which structure the semiconductor material has remained below the spacer elements 7 and the cutout 8 is present between these portions of the semiconductor material at the sidewalls of two opposite trench fillings. The upper source-drain regions 10 are formed in the respective upper portions by the implantation. Corresponding implantations for the lower source-drain regions 9 are then additionally introduced.

The lower boundary 12 of the upper source-drain regions 10 and the lower boundary 13 of the lower source-drain regions 9 are depicted by broken lines. The lower boundary 13 of the implantation introduced for the lower source-drain regions 9 is preferably present at a depth such that a continuous lower source-drain region 9 is formed in the manner of a ground plate. However, it may also suffice to introduce the relevant implantation only about as far as the broken line 13*a* depicted as an alternative. The upper boundary 14 of the lower source-drain region 9 and the lower boundary 12 of the upper source-drain region 10 enclose the respective channel region 11. During the fabrication of the lower doped regions 9, the channel region 11 is covered e.g., by prior deposition of a suitably patterned nitride layer at the walls of the cutout 8 and is thus protected against a penetration of the dopant. The lateral portions of the lower source-drain region 9 arise as a result of a diffusion of the introduced dopant during the annealing of the implants.

Figure 3:
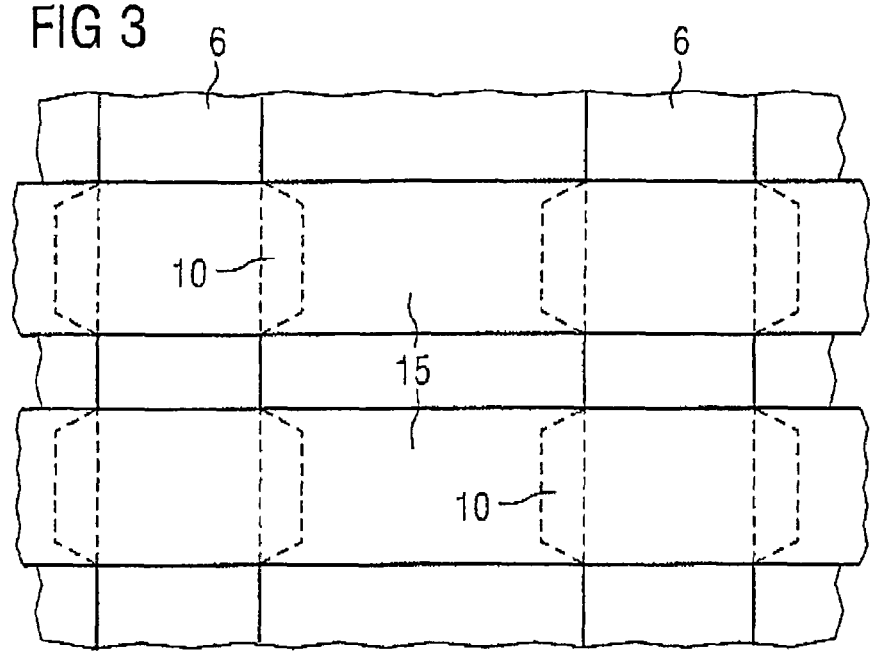
FIGS. 3 and 4 show plan views of the memory cell array after different steps of the fabrication method.

In accordance with the diagrammatic plan view illustrated in FIG. 3, strip-type photoresist masks 15 are then applied to the top side in order firstly to remove the insulating material present on the top side, in particular the layer portion 6 fabricated preferably by oxidation of polysilicon, and then to remove the electrically conductive layer 5 and the semiconductor material of the semiconductor body 1 in the regions between the strips of the photoresist mask. In FIG. 3, the lateral boundaries of the upper source-drain regions 10 are additionally depicted by broken lines as concealed contours.

Figure 4:
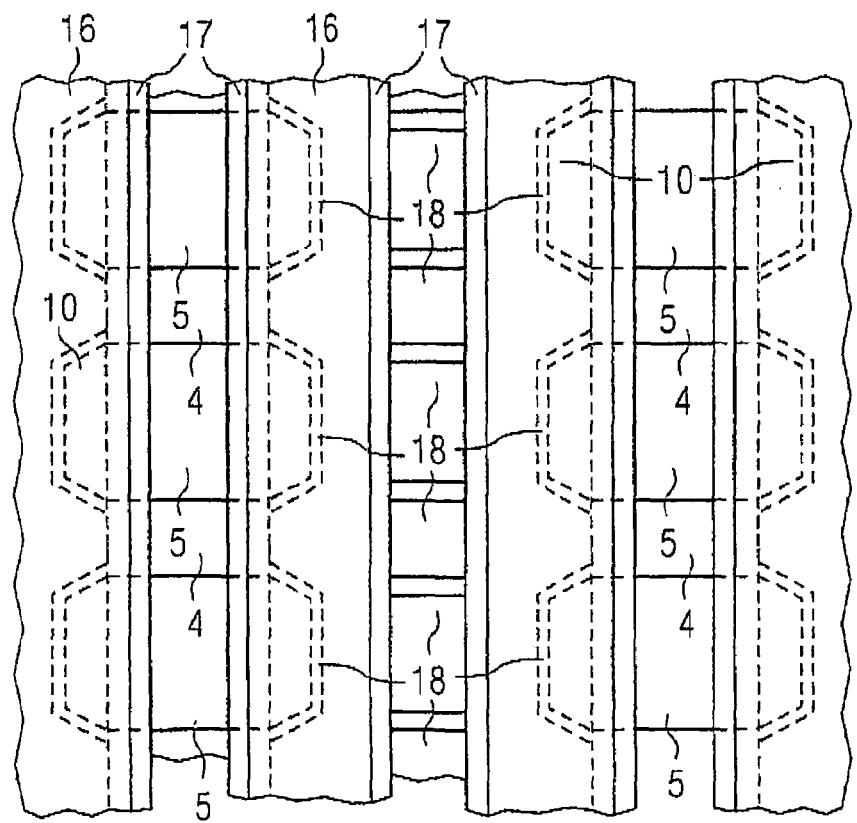

FIG. 4 illustrates the plan view in accordance with FIG. 3 after the strip-type mask of the layer portion 6. The mask being fabricated from oxidized polysilicon or else a different material, has been removed in this region and the walls of the now enlarged cutouts 8 between the trench fillings and also the surface of the semiconductor material at the sidewalls of the trench fillings, have been coated with a thin dielectric layer 18, preferably an oxide layer. The dielectric layer 18 is provided as gate dielectric on the semiconductor material at the sidewalls of the trench fillings.

The gate electrodes 16 are fabricated in the cutouts, to be precise in such a way that they partially overlap a trench filling. The gate electrodes 16 are covered with insulating spacer elements 17 on both sides with regard to their longitudinal directions. The electrically conductive layers 5 are removed in the region between the strips of the photoresist mask 15 so that there is a conductive connection between the regions of the individual cells only in the bottom region of the trenches.

FIG. 5 illustrates this structure in a cross-section, which occupies the position of the cross-section A in FIG. 9, although FIG. 5 only shows an intermediate product in the case of which the bit lines have not yet been fabricated. In this case, portions of the electrically conductive layers 5, which are in each case delimited on all sides to individual cells, are situated on the top sides of the trench fillings made of dielectric material 4. It can also be seen here that the two gate electrodes 16, which are provided for the channel regions 111 arranged at two mutually opposite sidewalls of the dielectric material 4, are arranged in a manner electrically isolated from one another in each case in the active trenches fabricated between the trench fillings. The sides of the gate electrodes 16 are insulated with the spacer elements 17, e.g. made of nitride. There may also be applied on the gate electrodes 16 a strip-type layer 19 made of polysilicon, tungsten or tungsten silicide and a hard mask layer 20 for the patterning of the gate electrodes.

A cross-section through the memory cell array in the position of the section B depicted in FIG. 9 is illustrated in FIG. 6 for this intermediate product. It can be seen there that the material of the gate electrodes 16 is also present in the region between the individual memory cells in the longitudinal direction of the trenches and is patterned identically there. The gate electrodes 16 patterned in strip form thus form the word lines, which connect together a respective strip of memory cells arranged along a trench filling. The electrically conductive layer 5 is absent in the regions between the individual memory cells. Between the individual memory cells, the portions made of semiconductor material are absent at the sidewalls of the regions made of dielectric material 4. The source-drain regions and channel regions of the individual cells are thus interrupted in the longitudinal direction of the word lines and delimited to the individual cells in this way.

Figure 7:
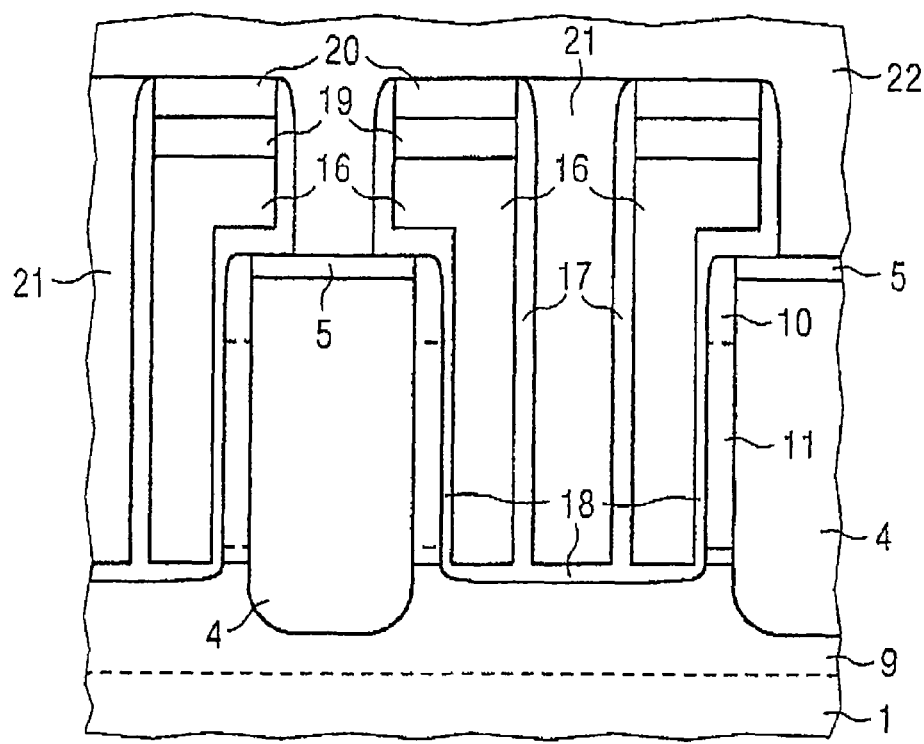

In accordance with the cross-section illustrated in FIG. 7, further method steps also follow, but these are known per se from semiconductor technology. Firstly, a first passivation (preferably a nitride) is deposited and the remaining openings are filled with an insulation layer 21 (preferably BPSG [borophosphosilicate glass]). These method steps also include opening at least partly self-aligned contact holes in connection with the bit lines 22 to be fabricated. A suitable material for the bit lines is, e.g., tungsten. The bit lines 22 are applied on the electrically conductive layers 5 and contact-connected, so that an electrically conductive connection to the upper source-drain regions 10 is fabricated here. However, it is also possible to use polysilicon-filled contact holes in connection with aluminum interconnects or to use a copper-based metallization scheme, likewise known per se.

Figure 8:
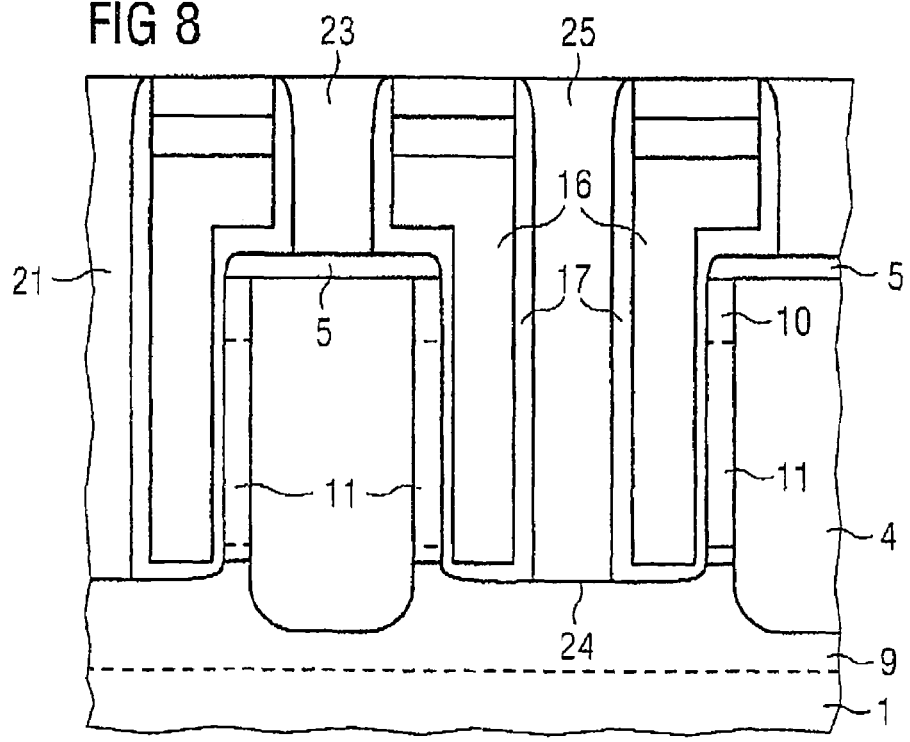
FIG. 8 shows a cross-section through an intermediate product of an alternative fabrication method.

FIG. 8 illustrates in cross-section an alternative exemplary embodiment, in which the dielectric layer 18 provided for the gate dielectric is removed in the region between the gate electrodes 16. Thus, interfaces 24 of the lower source-drain regions 9, which are continuous here as ground plate, are in each case uncovered there. Contact hole fillings 23, 25 for the electrically conductive layers 5 and the uncovered interfaces 24 of the lower source-drain regions 9, respectively, are introduced into the corresponding openings above them. An appropriate material for the contact hole fillings is, e.g., polysilicon. This material is leveled at the top side and patterned as required using a suitable photomask technique. The bit lines are then fabricated in a manner running transversely with respect to the word lines (not depicted in FIG. 8). The bit lines are applied in an electrically insulated manner with respect to the contact hole fillings 25 of the ground plate and are patterned in strip form in such a way that the electrically conductive layers 5 of the cells are connected. Between the bit lines and parallel thereto it is possible to produce a principle arbitrary number of similar conductor strips with contact on the relevant contact hole fillings 25 for the connection of the ground plate.

Although the present invention and its advantages have been described in detail, it should be understood that various changes, substitutions and alterations can be made herein without departing from the spirit and scope of the invention as defined by the appended claims.

What is claimed is:

1. A method for fabricating a semiconductor device, the method comprising:
   forming a trench in a semiconductor body;
   forming a region of dielectric material within at least a lower portion of the trench;
   doping an upper portion of the semiconductor body;
   forming a cutout in the semiconductor material such that a vertical strip of semiconductor material remains along a sidewall of the dielectric material;
   doping a lower portion of the semiconductor body adjacent the sidewall of the dielectric material;
   forming a gate dielectric layer over the vertical strip of semiconductor material; and
   arranging a gate electrode in the cutout.

2. The method of claim 1, wherein the gate electrode is patterned as portion of a word line.

3. The method of claim 1, further comprising filling an upper portion of the trench with electrically conductive layer that is in contact with the adjoining semiconductor material.

4. The method of claim 3, further comprising forming an electrical connection to the electrically conductive layer, said electrical connection being insulated from the gate electrode and being electrically coupled to a bit line.

5. The method of claim 1, wherein doping an upper portion of the semiconductor body and doping a lower portion of the semiconductor body comprise forming two separate implantation steps.

6. The method of claim 1 wherein forming a trench comprises forming trenches running parallel to one another.

7. The method of claim 6, wherein forming a cutout comprises forming cutouts spaced from sidewalls of two adjacent trench fillings, so that vertical strips of semiconductor material remain at both mutually opposite sidewalls of the trench fillings.

8. The method of claim 7, wherein doping a lower portion of the semiconductor body comprises forming lower source-drain regions at sidewalls of the regions made of dielectric material, wherein, in the longitudinal direction of the trenches, the semiconductor material and the electrically conductive layers are removed in sections for the purpose of forming isolated cells.

9. The method of claim 8, wherein:
   forming a gate dielectric layer comprises applying the dielectric layer to the semiconductor material at the sidewalls of the regions made of dielectric material;
   arranging a gate electrode in the cutout comprises arranging two mutually isolated gate electrodes in front of mutually opposite sidewalls of the regions made of dielectric material, the two mutually isolated gate electrodes being patterned as portions of isolated word lines.

10. The method as claimed in claim 1, wherein doping a lower portion of the semiconductor body comprises forming a continuous doped region in the manner of a ground plate.

11. The method of claim 10, wherein arranging a gate electrode in the cutout comprises arranging two mutually isolated gate electrodes in front of mutually opposite sidewalls of the dielectric materials and wherein the ground plate is provided with an electrical connection between the two mutually isolated gate electrodes.

12. The method as claimed in claim 1, wherein the semiconductor body comprises a semiconductor substrate.

13. A method for fabricating a semiconductor device, the method comprising:
   forming at least one trench in a top side of a semiconductor body;
   filling the trench with dielectric material and an upper electrically conductive layer that is in contact with adjoining semiconductor material;
   introducing an implantation of dopant into an upper portion of the semiconductor body, the upper portion being connected to an electrically conductive layer that serves as an upper source-drain region;
   forming a cutout in the semiconductor material at a distance from a sidewall of the trench filling, so that a vertical strip of semiconductor material with regard to the top side remains at the sidewall of the region made of dielectric material;
   introducing an implantation of dopant into a lower portion of the semiconductor body at a sidewall of the region made of dielectric material, the lower portion of the semiconductor body serving as a lower source-drain region;
   forming a gate dielectric layer to the semiconductor material at the sidewall of the region made of dielectric material;
   arranging a gate electrode in the cutout, the gate electrode being patterned as portion of a word line; and
   forming an electrical connection to the electrically conductive layer, said electrical connection being insulated from the gate electrode and being electrically coupled to a bit line.

14. The method as claimed in claim 13 wherein:
   forming at least one trench comprises forming trenches running parallel to one another;
   filling the trench comprises filling the trenches with dielectric material and an upper electrically conductive layer, the upper electrically conductive material being in contact with adjoining semiconductor material on both sides;
   forming a cutout comprises forming cutouts and spaced from sidewalls of two adjacent trench fillings, so that vertical strips of semiconductor material remain at both mutually opposite sidewalls of the trench fillings;
   introducing an implantation of dopant into a lower portion of the semiconductor body comprises forming lower source-drain regions at sidewalls of the regions made of dielectric material, wherein, in the longitudinal direction of the trenches, the semiconductor material and the electrically conductive layers are removed in sections for the purpose of forming isolated cells;

forming a gate dielectric layer comprises applying the dielectric layer to the semiconductor material at the sidewalls of the regions made of dielectric material;

arranging a gate electrode in the cutout comprises arranging two mutually isolated gate electrodes in front of mutually opposite sidewalls of the regions made of dielectric material, the two mutually isolated gate electrodes being patterned as portions of isolated word lines.

15. The method as claimed in claim 14, wherein introducing an implantation of dopant into a lower portion of the semiconductor body comprises forming a continuous doped region in the manner of a ground plate, wherein the ground plate is provided with an electrical connection between the gate electrodes.

16. The method as claimed in claim 13, wherein the semiconductor body comprises a semiconductor substrate.

17. A method for fabricating a 1-transistor DRAM cell in which two doped regions are formed in semiconductor material as source and drain at a distance from one another, and in which a gate electrode is arranged above a channel region that resides between the source and drain regions, the gate electrode being isolated from said channel region material by a gate dielectric and the channel region is bounded by dielectric material on the side remote from the gate electrode, the method comprising a plurality of steps, wherein:

in a first step, at least one trench is fabricated in a top side of a semiconductor body;

in a second step, the trench is filled with dielectric material and an upper electrically conductive layer in contact with the adjoining semiconductor material;

in a third step, an implantation of dopant is introduced into an upper portion of the semiconductor material with regard to the semiconductor body, which portion is connected to the electrically conductive layer for the purpose of forming an upper source-drain region;

in a fourth step, a cutout is fabricated in the semiconductor material at a short distance from a sidewall of the trench filling, so that a vertical strip of semiconductor material with regard to the top side remains at the sidewall of the region made of dielectric material;

in a fifth step, an implantation of dopant is introduced into a lower portion of the semiconductor material with regard to the semiconductor body at the sidewall of the region made of dielectric material for the purpose of forming a lower source-drain region;

in a sixth step, a dielectric layer provided as gate dielectric is applied to the semiconductor material at the sidewall of the region made of dielectric material;

in a seventh step, a gate electrode is arranged in the cutout and patterned as a portion of a word line; and in an eighth step, an electrical connection to the electrically conductive layer is fabricated as a portion of a bit line, said electrical connection being insulated from the gate electrode.

18. The method as claimed in claim 17 for fabricating an arrangement comprising a plurality of 1-transistor DRAM cells, wherein:

in the first step, trenches running parallel to one another are fabricated;

in the second step, the trenches are filled with dielectric material and a respective upper electrically conductive layer, which is in contact with the adjoining semiconductor material on both sides;

in the fourth step, cutouts are in each case fabricated at a short distance from the sidewalls of two adjacent trench fillings, so that vertical strips of semiconductor material remain at both mutually opposite sidewalls of the trench fillings;

in the fifth step, an implantation of dopant for the purpose of forming lower source-drain regions is introduced into the lower portions of the semiconductor material at the sidewalls of the regions made of dielectric material and, in the longitudinal direction of the trenches, the semiconductor material and the electrically conductive layers are removed in sections for the purpose of forming isolated cells;

in the sixth step, the dielectric layer provided as gate dielectric is in each case applied to the semiconductor material at the sidewalls of the regions made of dielectric material;

in the seventh step, two mutually isolated gate electrodes are in each case arranged in front of mutually opposite sidewalls of the regions made of dielectric material and are patterned as portions of isolated word lines; and in the eighth step, an electrical connection to the electrically conductive layers is in each case fabricated as a portion of a respective bit line, said electrical connection being insulated from the gate electrodes.

19. The method as claimed in claim 18, wherein:

in the fifth step, the implantations of dopant into the lower portions of the semiconductor material are performed for the purpose of forming a continuous doped region in the manner of a ground plate, and in a further step, said ground plate is provided with an electrical connection between the gate electrodes.

* * * * *